(12) United States Patent
Nishimura et al.

(10) Patent No.: US 10,755,893 B2
(45) Date of Patent: Aug. 25, 2020

(54) CHARGED PARTICLE BEAM WRITING METHOD AND CHARGED PARTICLE BEAM WRITING APPARATUS

(71) Applicant: NuFlare Technology, Inc., Yokohama-shi (JP)

(72) Inventors: Rieko Nishimura, Yokohama (JP); Takahito Nakayama, Chigasaki (JP)

(73) Assignee: NuFlare Technology, Inc., Yokohama-shi (JP)

( * ) Notice: Subject to any disclaimer, the term of this patent is extended or adjusted under 35 U.S.C. 154(b) by 5 days.

(21) Appl. No.: 16/260,445

(22) Filed: Jan. 29, 2019

(65) Prior Publication Data

US 2019/0237297 A1 Aug. 1, 2019

(30) Foreign Application Priority Data

Jan. 31, 2018 (JP) .................................. 2018-015846

(51) Int. Cl.
| | | |
|---|---|---|
| H01J 37/304 | (2006.01) | |
| H01J 37/317 | (2006.01) | |
| H01J 37/20 | (2006.01) | |
| H01J 37/24 | (2006.01) | |
| H01J 37/147 | (2006.01) | |

(52) U.S. Cl.
CPC ...... H01J 37/3045 (2013.01); H01J 37/1472 (2013.01); H01J 37/20 (2013.01); H01J 37/24 (2013.01); H01J 37/3174 (2013.01); *H01J 2237/202* (2013.01); *H01J 2237/24528* (2013.01); *H01J 2237/31793* (2013.01)

(58) Field of Classification Search
CPC .... H01J 37/30; H01J 37/3002; H01J 37/3007; H01J 37/302; H01J 37/3023; H01J 37/3026; H01J 37/304; H01J 37/3045

USPC ................................ 250/492.1, 492.2, 492.3
See application file for complete search history.

(56) References Cited

U.S. PATENT DOCUMENTS

| | | | |
|---|---|---|---|
| 2002/0008207 A1* | 1/2002 | Muraki ................. | B82Y 10/00 250/398 |
| 2009/0014663 A1* | 1/2009 | Nishimura ............ | B82Y 10/00 250/396 R |

FOREIGN PATENT DOCUMENTS

| | | |
|---|---|---|
| JP | 2003-86485 | 3/2003 |
| JP | 2011-228498 | 11/2011 |

OTHER PUBLICATIONS

Korean Office Action with machine generated English translation dated Jun. 4, 2020 in counterpart Korean Patent Application No. 10-2019-0010313 (18 pages).

* cited by examiner

*Primary Examiner* — Jason L McCormack
(74) *Attorney, Agent, or Firm* — Oblon, McClelland, Maier & Neustadt, L.L.P.

(57) ABSTRACT

A charged particle beam writing method includes acquiring the deviation amount of the deflection position per unit tracking deflection amount with respect to each tracking coefficient of a plurality of tracking coefficients having been set for adjusting the tracking amount to shift the deflection position of a charged particle beam on the writing target substrate in order to follow movement of the stage on which the writing target substrate is placed, extracting a tracking coefficient based on which the deviation amount of the deflection position per the unit tracking deflection amount is closest to zero among the plurality of tracking coefficients, and writing a pattern on the writing target substrate with the charged particle beam while performing tracking control in which the tracking amount has been adjusted using the tracking coefficient extracted.

10 Claims, 12 Drawing Sheets

CHARGED PARTICLE BEAM WRITING METHOD AND CHARGED PARTICLE BEAM WRITING APPARATUS

CROSS-REFERENCE TO RELATED APPLICATION

This application is based upon and claims the benefit of priority from prior Japanese Patent Application No. 2018-015846 filed on Jan. 31, 2018 in Japan, the entire contents of which are incorporated herein by reference.

BACKGROUND OF THE INVENTION

Field of the Invention

Embodiments of the present invention relate to a charged particle beam writing method and a charged particle beam writing apparatus, and, for example, to a tracking control method when performing electron beam deflection in an electron beam writing apparatus.

Description of Related Art

In recent years, with high integration of LSI, the line width (critical dimension) of semiconductor device circuits is decreasing year by year. An electron beam (EB) writing technique which has excellent resolution is used as a method of producing an exposure mask (also referred to as a reticle) for forming a circuit pattern on such semiconductor devices. FIG. 14 is a conceptual diagram explaining operations of a variable-shaped electron beam writing or "drawing" apparatus. The variable-shaped electron beam writing apparatus operates as described below. A first aperture plate 410 has a rectangular aperture 411 for shaping an electron beam 330. A second aperture plate 420 has a variable shape aperture 421 for shaping the electron beam 330 having passed through the aperture 411 of the first aperture plate 410 into a desired rectangular shape. The electron beam 330 emitted from a charged particle source 430 and having passed through the aperture 411 of the first aperture plate 410 is deflected by a deflector so as to pass through a part of the variable shape aperture 421 of the second aperture plate 420, and thereby to irradiate a target object or "sample" 340 placed on a stage which continuously moves in one predetermined direction (e.g., x direction). In other words, a rectangular shape that can pass through both the aperture 411 of the first aperture plate 410 and the variable shape aperture 421 of the second aperture plate 420 is used for pattern writing in a writing region of the target object 340 on the stage continuously moving in the x direction. This method of forming a given shape by letting beams pass through both the aperture 411 of the first aperture plate 410 and the variable shape aperture 421 of the second aperture plate 420 is referred to as a variable shaped beam (VSB) method.

In the VSB electron beam writing, writing is performed in each subfield, which is obtained by dividing the writing region of the substrate into meshes, while moving the stage. In that case, tracking control that makes the deflection position follow the movement of the stage is carried out so that the beam irradiation position may not be displaced along with the stage movement. If the tracking control is reset for each subfield, the reset time becomes necessary whenever the subfield is changed. Therefore, the tracking control is executed per region larger than the subfield (e.g., refer to Japanese Patent Application Laid-open (JP-A) No. 2011-228498). Accordingly, as long as the same control region for tracking is used even when the subfield is changed, there is no need of resetting the tracking voltage. Thus, the tracking control needs to be performed not only during writing inside the subfield but also during shifting between the subfields.

In the tracking control, the amount of tracking is calculated so as to add the voltage equivalent to the calculated tracking amount to the deflector. However, actually, since some deviation may occur, the tracking voltage is corrected using a tracking coefficient. Regarding this, there is disclosed a method of correcting the tracking amount ($\Delta X_s$ and $\Delta Y_s$) itself by using a coefficient inside the writing apparatus, instead of correcting the tracking voltage by using a tracking coefficient (e.g., refer to Japanese Patent Application Laid-open (JP-A) No. 2003-086485).

Meanwhile, in the electron beam writing, for ensuring the line width accuracy needed for micropatterning, it has been performed to diminish shot noise and pattern edge roughness by making resist less sensitive and increasing the dose. However, if the target is irradiated with an increased amount of irradiation energy as a higher density electron beam in a short time, a problem occurs in that the substrate overheats resulting in a phenomenon called "resist heating" of changing the resist sensitivity and degrading the line width accuracy. Then, in order to avoid dimensional degradation of written patterns and resist scattering which occur due to the resist heating, multiple writing that divides a required dose into a plurality of writing processing (passes) is performed in the electron beam writing. For example, the first pass is written by the forward (FWD) movement of the stage, and the second pass is written by the backward (BWD) movement of the stage. Although, conventionally, writing processing at even number times is generally performed in multiple writing, it has been required from a viewpoint of throughput improvement to execute multiple writing with the minimum number passes which renders one shot dose capable of suppressing the influence of dimensional degradation, etc. due to resist heating to be within an acceptable range. Consequently, it has been required to selectively perform multiple writing using odd number of passes instead of that using even number of passes. However, in the multiple writing with odd number passes, since the number of times of FWD movement and that of BWD movement of the stage are not equal, errors occurring along with the stage movement cannot be cancelled out with each other between the FWD and BWD movements, which results in a problem of writing accuracy degradation compared with the case of multiple writing with even number passes.

BRIEF SUMMARY OF THE INVENTION

According to one aspect of the present invention, a charged particle beam writing method includes acquiring a deviation amount of a deflection position per unit tracking deflection amount with respect to each tracking coefficient of a plurality of tracking coefficients having been set for adjusting a tracking amount to shift the deflection position of a charged particle beam on a writing target substrate in order to follow movement of a stage on which the writing target substrate is placed; extracting a tracking coefficient based on which the deviation amount of the deflection position per the unit tracking deflection amount is closest to zero among the plurality of tracking coefficients; and writing a pattern on the writing target substrate with the charged particle beam while performing tracking control in which the tracking amount has been adjusted using the tracking coefficient extracted.

According to another aspect of the present invention, a charged particle beam writing apparatus includes a writing mechanism configured to include an emission source for emitting a charged particle beam, a stage for mounting a substrate thereon, and a deflector for deflecting the charged particle beam, and to write a pattern on the substrate with the charged particle beam while moving the stage and shifting a deflection position of the charged particle beam on the substrate to follow movement of the stage; a deflection control circuit configured to control a tracking amount of the charged particle beam which is deflected by the deflector, using a tracking coefficient for adjusting the tracking amount to shift the deflection position of the charged particle beam on the substrate in order to follow the movement of the stage; a tracking coefficient generation circuit configured to generate a plurality of tracking coefficients centering on a value of an existing tracking coefficient currently used by the deflection control circuit; and an update circuit configured to update the existing tracking coefficient to a tracking coefficient based on which a deviation amount of the deflection position per unit tracking deflection amount is closest to zero among the plurality of tracking coefficients.

DETAILED DESCRIPTION OF THE INVENTION

Embodiments below describe a method for reducing errors occurring along with the stage movement.

Embodiments below describe a configuration using an electron beam as an example of a charged particle beam. The charged particle beam is not limited to the electron beam, and other charged particle beam such as an ion beam may also be used. A variable-shaped beam type writing apparatus will be described as an example of a charged particle beam apparatus.

First Embodiment

Figure 1:
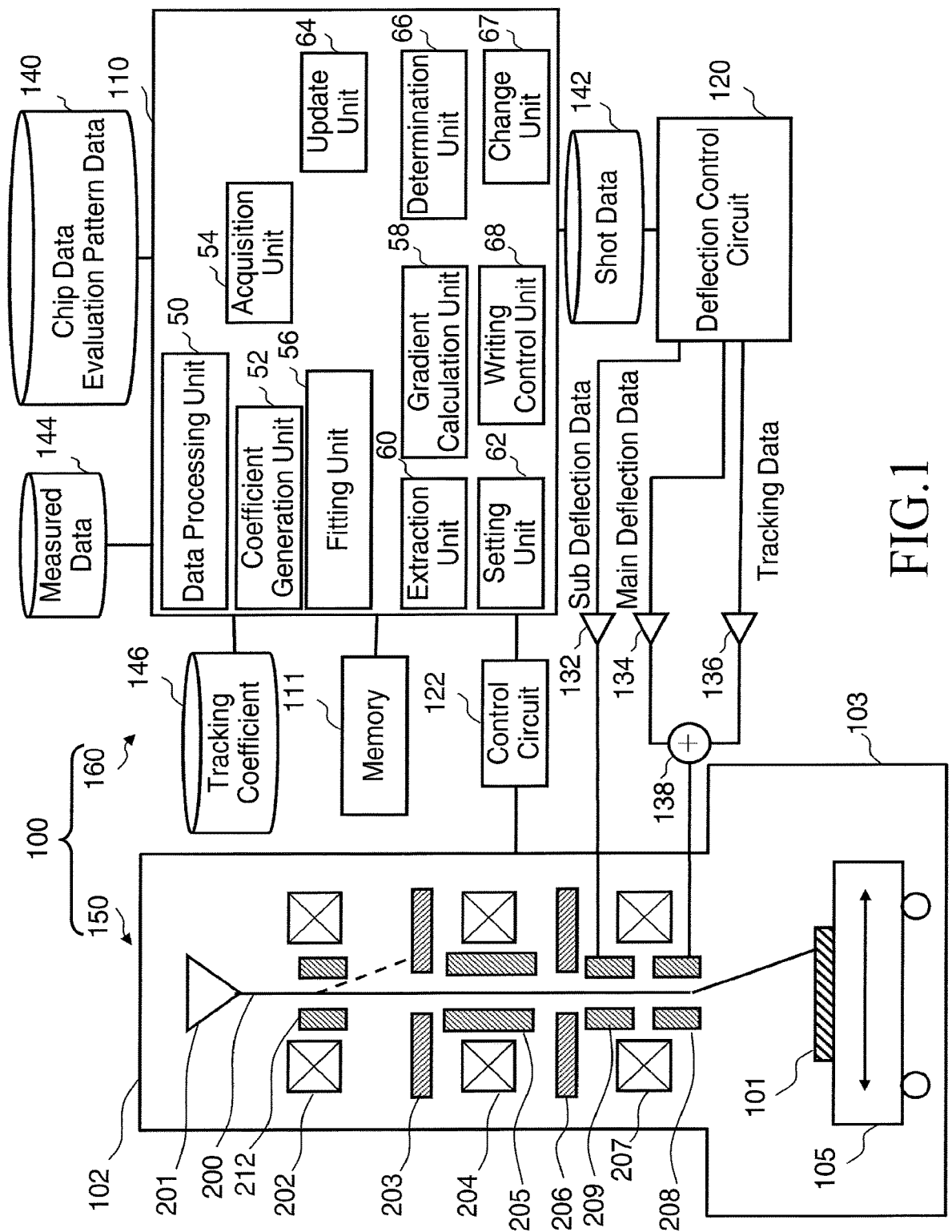
FIG. 1 is a conceptual diagram showing a configuration of a writing apparatus according to a first embodiment.

FIG. 1 is a conceptual diagram showing a configuration of a writing or "drawing" apparatus according to a first embodiment. As shown in FIG. 1, a writing apparatus 100 includes a writing mechanism 150 and a control system circuit 160. The writing apparatus 100 is an example of a charged particle beam writing apparatus. Particularly, it is an example of a variable shaped beam (VSB) writing apparatus. The writing mechanism 150 includes an electron optical column (electron beam column) 102 and a writing chamber 103. In the electron optical column 102, there are disposed an electron gun 201, an illumination lens 202, a blanking deflector 212, a first shaping aperture substrate 203, a projection lens 204, a deflector 205, a second shaping aperture substrate 206, an objective lens 207, a main deflector 208, and a sub deflector 209. In the writing chamber 103, an XY stage 105 is disposed. On the XY stage 105, there is placed a target object or "sample" 101, such as a mask, on which resist has been applied to be written. The target object 101 is, for example, an exposure mask used for manufacturing semiconductor devices. The target object 101 may be, for example, a mask blank on which resist has been applied and no pattern has yet been written.

The control system circuit 160 includes a control computer 110, a memory 111, a deflection control circuit 120, a control circuit 122, DAC (digital-analog converter) amplifiers 132, 134 and 136, an adder 138, and storage devices 140, 142, 144, and 146 such as magnetic disk drives. The control computer 110, the memory 111, the deflection control circuit 120, the control circuit 122, and the storage devices 140, 142, 144 and 146 are connected with each other through a bus (not shown). The deflection control circuit 120 is connected to the DAC amplifiers 132, 134, and 136. Outputs of the DAC amplifiers 134 and 136 are connected to the adder 138.

The DAC amplifier 132 is connected to the sub deflector 209. An output of the DAC amplifier 134 is connected to the adder 138. An output of the DAC amplifier 136 is connected to the adder 138. Then, an output of the adder 138 is connected to the main deflector 208.

Respective digital signals for controlling each corresponding DAC amplifier are output from the deflection control circuit 120 to each DAC amplifier. Then, in each DAC amplifier, the digital signal is converted to an analog signal and amplified to be output as a deflection voltage. Particularly, in the first embodiment, an additional value (sum) of two outputs from the DAC amplifiers 134 and 136 is applied as a deflection voltage to the main deflector 208. An output of the DAC amplifier 132 is applied as a deflection voltage to the sub deflector 209. Electron beams are deflected by these deflection voltages. The control circuit 122 controls the operation of the writing mechanism 150, under the control of the writing control unit 66.

In the control computer 110, there are arranged a data processing unit 50, a coefficient generation unit 52, an acquisition unit 54, a fitting unit 56, a gradient calculation unit 58, an extraction unit 60, a setting unit 62, an update unit 64, a determination unit 66, a change unit 67, and a writing control unit 68. Each of " . . . units" such as the data processing unit 50, the coefficient generation unit 52, the acquisition unit 54, the fitting unit 56, the gradient calculation unit 58, the extraction unit 60, the setting unit 62, the update unit 64, the determination unit 66, the change unit 67, and the writing control unit 68 includes a processing circuitry. As the processing circuitry, for example, an electric circuit, computer, processor, circuit board, quantum circuit, or semiconductor device is used. Each " . . . unit" may use a common processing circuitry (same processing circuitry), or different processing circuitries (separate processing circuitries). Information input and output to/from the data processing unit 50, the coefficient generation unit 52, the acquisition unit 54, the fitting unit 56, the gradient calculation unit 58, the extraction unit 60, the setting unit 62, the update unit 64, the determination unit 66, the change unit 67, and the writing control unit 68, and information being operated are stored in the memory 111 each time.

Data of a writing target chip pattern, (that is, chip data), is input from the outside of the writing apparatus 100, and stored in the storage device 140. Moreover, data of an evaluation pattern to be described later, (that is, evaluation pattern data), is also input from the outside of the writing apparatus 100, and stored in the storage device 140. Each of the chip data and the evaluation pattern data defines the figure code indicating the figure type of a figure pattern to be written, arrangement coordinates, dimensions, etc. In addition, dose information may be defined in the the chip data and the evaluation pattern data. Alternatively, dose information may be input as another data.

FIG. 1 shows a configuration necessary for describing the first embodiment. Other configuration elements generally necessary for the writing apparatus 100 may also be included therein. For example, although a multistage deflector of two stages of the main deflector 208 and the sub deflector 209 is herein used for position deflection, a single stage deflector or a multistage deflector of three or more stages may also be used for position deflection. Moreover, the main deflector 208 and the sub deflector 209 are arranged such that they are configured by, for example, eight pole electrodes for each of which a DAC amplifier is disposed and they surround the passage region of electron beams. It should be understood that the deflector 205 for variable shaping is configured by, for example, four pole electrodes for each of which a DAC amplifier (not shown) is provided. Similarly, it should be understood that the blanking deflector 212 is configured by, for example, two pole electrodes in at least one of which a DAC amplifier (not shown) or a pulse generator (not shown) is provided. Moreover, for example, an input device, such as a mouse and a keyboard, a monitoring device, and an external interface circuit may be connected to the writing apparatus 100.

Figure 2:
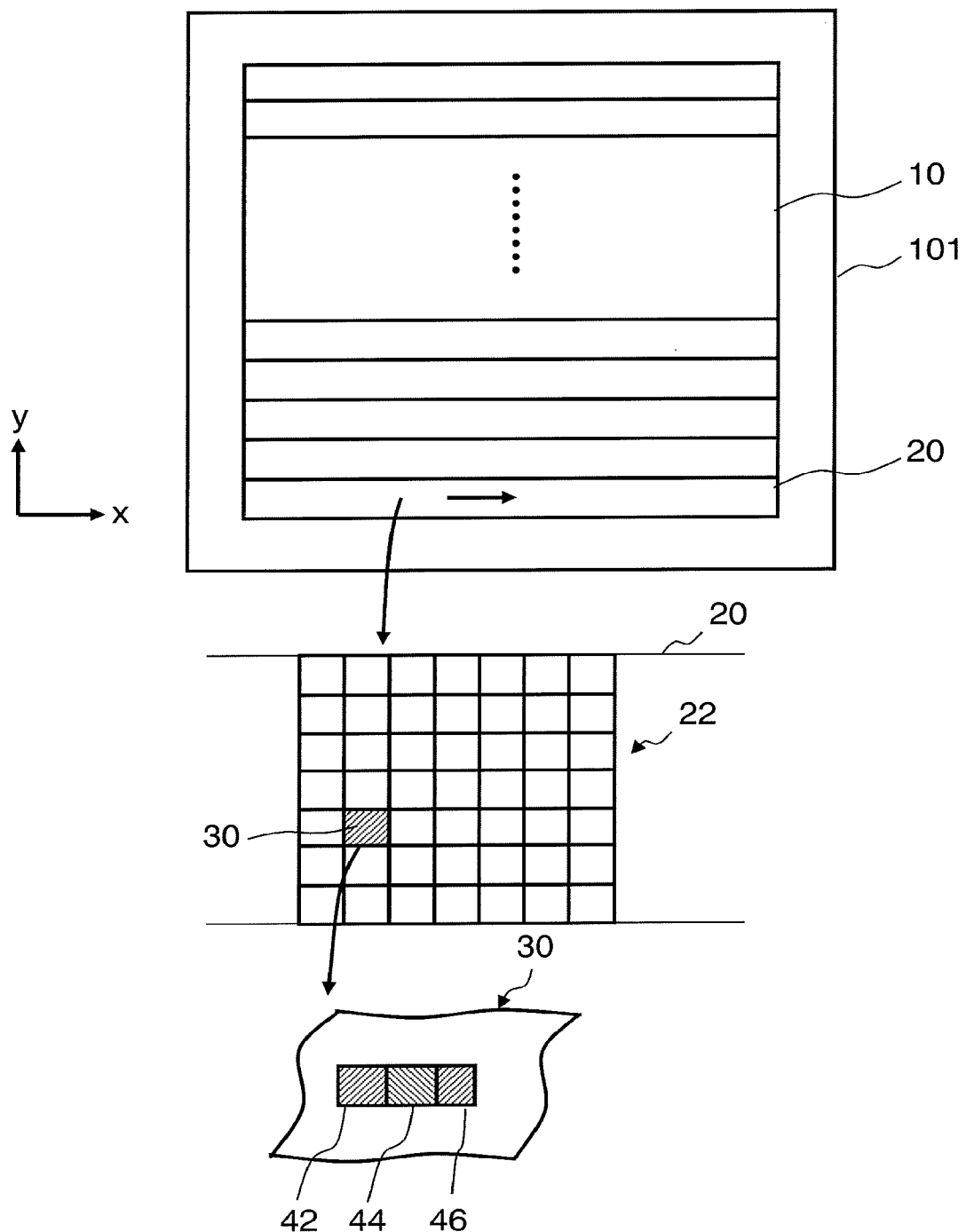
FIG. 2 is a conceptual diagram for explaining each region according to the first embodiment

FIG. 2 is a conceptual diagram for explaining each region according to the first embodiment. As shown in FIG. 2, a writing region 10 of the target object 101 is virtually divided in the y direction, for example, into a plurality of stripe regions 20 each having a width deflectable in the y direction by the main deflector 208. Therefore, the main deflector 208 can perform deflection inside a main deflection region 22 whose side widths in the x and y directions are deflectable by the main deflector 208. Further, each of the stripe regions 20 is virtually divided into a plurality of mesh subfields (SFs) 30 (small regions) each having a size deflectable by the sub deflector 209. Shot FIGS. 42, 44, and 46 are written at respective corresponding shot positions in each SF 30.

A digital signal for controlling blanking is output from the deflection control circuit 120 to a blanking control DAC amplifier (not shown) or a pulse generator (not shown). The blanking control DAC amplifier or the pulse generator converts the digital signal to an analog signal, and amplifies it to be applied as a deflection voltage to the blanking deflector 212. The electron beam 200 is deflected by this deflection voltage, and a beam of each shot is formed by switching between beam On and beam Off.

A digital signal to control deflection for shaping is output from the deflection control circuit 120 to a DAC amplifier (not shown) for shaping deflection control. Then, in the DAC amplifier (not shown) for shaping deflection control, the digital signal is converted to an analog signal and amplified to be applied as a deflection voltage to the deflector 205. The electron beam 200 is deflected by this deflection voltage, and the opening passage position of the second shaping aperture substrate 206 through which the electron beam 200 having passed through the first shaping aperture substrate 203 passes is controlled, thereby a beam of each shot is variably shaped.

A digital signal for controlling main deflection is output from the deflection control circuit 120 to the DAC amplifier 134. Then, in the DAC amplifier 134, the digital signal is converted to an analog signal and amplified to be applied as a deflection voltage to the main deflector 208. The electron beam 200 is deflected by this deflection voltage, and thereby a beam of each shot is deflected to a reference position of a predetermined sub-field (SF) 30 in the virtually divided mesh like SF's. Simultaneously, a digital signal for tracking control is output from the deflection control circuit 120 to the DAC amplifier 136. Then, in the DAC amplifier 136, the digital signal is converted to an analog signal and amplified to be applied as a deflection voltage to the main deflector 208. When applying a deflection voltage to the main deflector 208, an added deflection voltage obtained by adding a deflection voltage for main deflection control and a deflection voltage for tracking control by the adder 138 is applied to the main deflector 208.

A digital signal for controlling sub deflection is output from the deflection control circuit 120 to the DAC amplifier 132. Then, in the DAC amplifier unit 132, the digital signal is converted to an analog signal and amplified to be applied as a deflection voltage to the sub deflector 209. The electron beam 200 is deflected by this deflection voltage, and thereby a beam of each shot is deflected to a corresponding shot position of a predetermined sub-field (SF) 30 in the virtually divided mesh like SFs.

The writing apparatus 100 performs writing processing in each stripe region 20 by using a deflector of two or more stages. Here, as an example, a two-stage deflector composed of the main deflector 208 and the sub deflector 209 is used. While the XY stage 105 is continuously moving in the −x direction, for example, writing is performed in the x direction in the first stripe region 20. In the case of writing each stripe region 20 once without performing multiple writing, it operates as follows, for example. After completing writing in the first stripe region 20, writing is performed in the same direction or in the opposite direction in the second stripe region 20. Then, in the same way, writing is performed in the third and subsequent stripe regions 20. When performing writing in each stripe region 20, the main deflector 208 sequentially deflects the electron beam 200 to a reference position (e.g., center) of the SF 30 such that the movement of the XY stage 105 is followed. The sub deflector 209 deflects the electron beam 200 from the reference position of each SF 30 to each shot position of an irradiating beam in the SF 30 concerned. Thus, the main deflector 208 and the sub deflector 209 have deflection regions of different sizes. The SF 30 is the smallest one in the deflection regions of the multistage deflector.

With respect to the electron beam 200 emitted from the electron gun 201 (emission unit), when passing through the blanking deflector 212 which is controlled by a deflection signal from the DAC amplifier for blanking or the pulse generator, the beam is controlled by the blanking deflector 212 to irradiate the whole of the rectangular, including a square, hole of the first shaping aperture substrate 203 when in a beam ON condition, and the whole of the beam is deflected by the blanking deflector 212 to be blocked by the first shaping aperture substrate 202 when in a beam OFF condition. The electron beam 200 that has passed through the first shaping aperture substrate 203 during the period, from the time of changing a beam OFF condition to a beam ON condition to the time of changing the beam ON condition to a beam OFF condition, serves as one shot of the electron beam. The blanking deflector 212 controls the direction of the passing electron beam 200 to alternately generate a beam ON condition and a beam OFF condition. For example, when in a beam ON condition, no voltage is applied to the blanking deflector 212, and, when in a beam OFF condition, a voltage should be applied to it. The dose per shot of the electron beam 200 to irradiate the target object 101 is adjusted depending upon the irradiation time t of each shot.

The electron beam 200 controlled in a beam ON condition as described above irradiates the whole of the first shaping aperture substrate 203 having a rectangular hole by the illumination lens 202. Then, first, the electron beam 200 is shaped to be a rectangle. After passing through the first shaping aperture substrate 203, the electron beam 200 of the first aperture image is projected onto the second shaping aperture substrate 206 by the projection lens 204. The first aperture image on the second shaping aperture substrate 206 is deflection-controlled by the deflector 205 so as to change (variably shape) the shape and dimensions of the beam. Such variable beam shaping is performed for each shot, and, for example, each shot is shaped to have different beam shape and dimensions. Then, after passing through the second shaping aperture substrate 206, the electron beam 200 of the second aperture image is focused by the objective lens 207, and deflected by the main deflector ¥208 and the sub deflector 209 to irradiate a desired position on the target object 101 placed on the XY stage 105 which moves continuously. FIG. 1 shows the case of using multiple stage deflection of the main and sub deflection for position deflection. In such a case, it suffices that the main deflector 208 deflects the electron beam 200 of the shot concerned to the reference position in an SF 30 while following the movement of the stage, and the sub deflector 209 deflects the beam of the shot concerned to each irradiation position in the SF. A desired figure pattern is written by repeating such operations and combining the shot figure of each shot.

Figure 3:
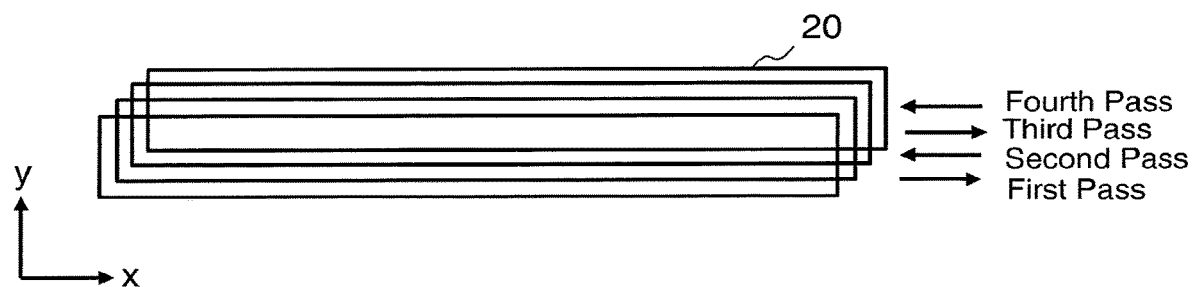
FIG. 3 illustrates a method of multiple writing according to the first embodiment.

FIG. 3 illustrates a method of multiple writing according to the first embodiment. When performing multiple writing, the stripe region 20 of each writing pass in the multiple writing is written a plurality of times while shifting the set position of the stripe region 20 for the writing pass, for example. The amount of shifting may be set depending upon the number of passes of multiple writing. For example, in the case of multiple writing with two passes, it is preferable to shift, for each pass, in the x and y directions by ½ of the y-direction width of the stripe region 20. For example, in the case of multiple writing with four passes, it is preferable to shift, for each pass, in the x and y directions by ¼ of the y-direction width of the stripe region 20. For example, in the first writing processing (first pass) of multiple writing, the writing proceeds in the x direction. Therefore, in that case, the XY stage 105 moves relatively in the −x direction (FWD (forward direction) movement). In the second writing processing (second pass) of multiple writing, the writing proceeds in the −x direction. Therefore, in that case, the XY stage 105 moves relatively in the +x direction (BWD (reverse direction) movement). In the third writing processing (third pass) of multiple writing, the writing proceeds in the x direction. Therefore, in that case, the XY stage 105 moves relatively in the −x direction (FWD (forward direction) movement). In the fourth writing processing (fourth pass) of multiple writing, the writing proceeds in the −x direction. Therefore, in that case, the XY stage 105 moves relatively in the +x direction (BWD (reverse direction) movement). As described above, writing is repeatedly performed while alternately reversing the writing direction for each pass. Although the example of the multiple writing with four passes is shown in FIG. 3, it is not limited thereto. It is sufficient to perform multiple writing depending on the number of passes having been set. Moreover, it is not limited to the case of alternately reversing the writing direction for each pass. Writing may proceed in the same direction in all the passes. Alternatively, not in alternate directions, writing may proceed in different directions in only some of all the passes.

Figure 4:
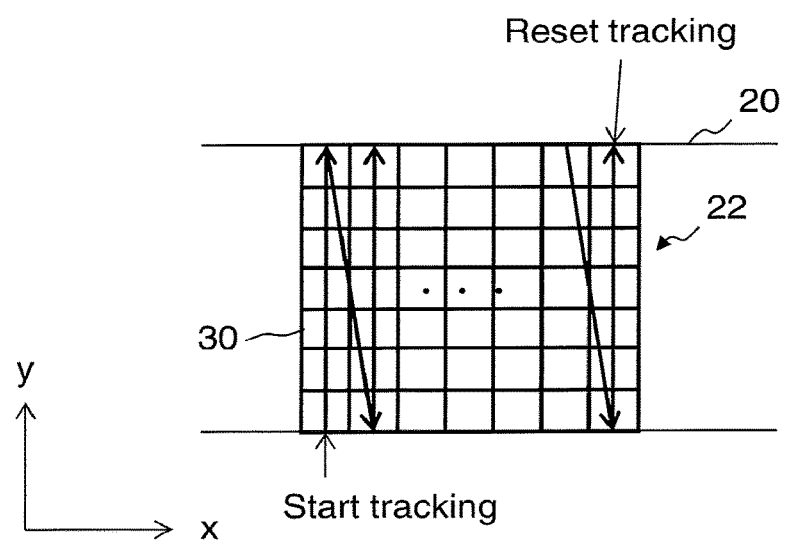
FIG. 4 illustrates an example of the contents of tracking control according to the first embodiment.

FIG. 4 illustrates an example of the contents of tracking control according to the first embodiment. The tracking control is carried out using the main deflector 208 in the first embodiment. For example, tracking control is performed for the writing in the main deflection region 22, which is deflectable by the main deflector 208, in the stripe region 20. Although FIG. 4 shows the case where the main deflection region 22 is used as a tracking control region, it is not limited thereto. It is also preferable to set a region larger than the SF 30 and smaller than the main deflection region 22, as a tracking control region. FIG. 4 shows the case where writing is performed while carrying out the FWD movement, and a plurality of SFs arrayed as a column in the y direction in the main deflection region 22 are written in order from the bottom SF 30 to the upper SF 30, and the columns of SFs 30 are written in order in the x direction. Then, tracking control is performed to follow the movement of the stage until all the SFs 30 in the main deflection region 22 concerned have been written. When the writing of all the SFs 30 in the main deflection region 22 concerned is completed, the tracking control is once reset to proceed to anew tracking control for the next main deflection region 22. Therefore, when the XY stage 105 moves continuously, the tracking control is also continuously performed not only during writing the inside of the SF 30 concerned but also during moving between SFs 30. In the first embodiment, the tracking control of the sub deflector 209 changing the deflection position (changing sub deflection data) performed during writing inside the SF 30 is called a sub deflection tracking control. Moreover, the tracking control of the main deflector 208 changing the deflection position (changing main deflection data) performed during moving between the SFs 30 is called a main deflection tracking control.

Figure 5A:
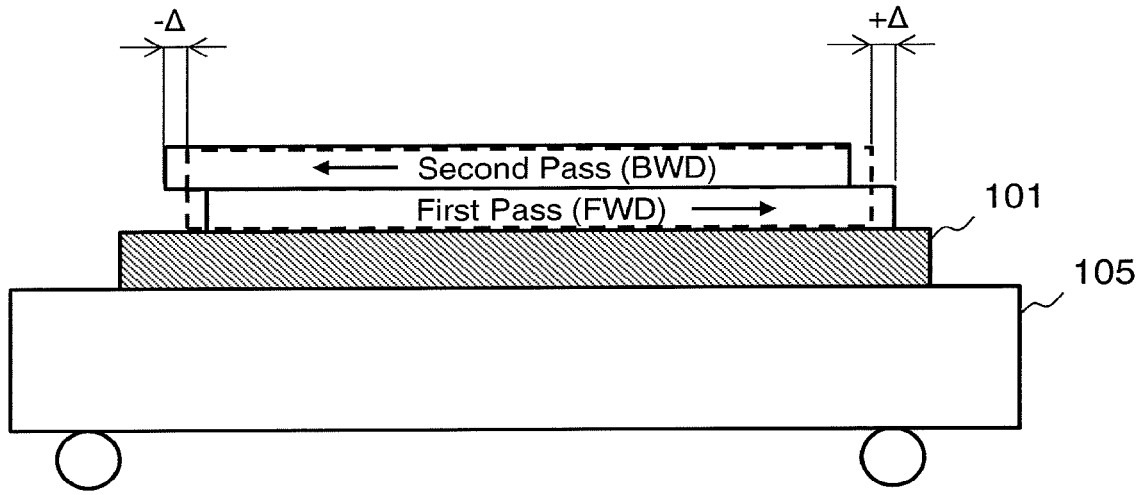
FIGS. 5A and 5B illustrate positional deviation of a pattern in multiple writing with even number passes and odd number passes according to the first embodiment.
Figure 5B:
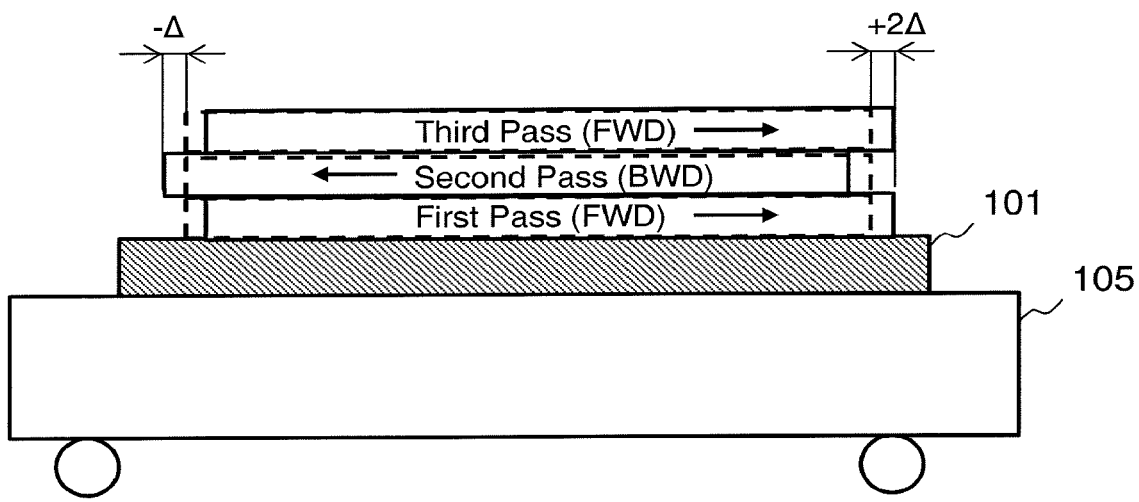

FIGS. 5A and 5B illustrate positional deviation of a pattern in multiple writing with even number passes and odd number passes according to the first embodiment. When correcting a deflection position by tracking control, a correction residual error may occur. In the case of occurrence of a correction residual, since the correction direction is reversed between the FWD movement and the BWD movement, the direction of pattern deviation also becomes reversed. Here, there will be described a case in which a positional deviation amount Δ is generated in each pass with respect to a design pattern (dotted line). For example, as shown in FIG. 5A, in the case of multiple writing with even number passes in which writing is performed in the first pass while carrying out the FWD movement, and in the second pass while carrying out the BWD movement, +Δ and −Δ are cancelled out each other when the positional deviation amount is averaged. Consequently, a tracking control error is unlikely to occur. On the other hand, as shown in FIG. 5B, in the case of multiple writing with odd number passes in which writing is performed in the first pass while carrying out the FWD movement, in the second pass while carrying out the BWD movement, and in the third pass while carrying out the FWD movement, although +Δ and −Δ are cancelled out each other when the positional deviation amount is averaged, +Δ still remains. Consequently, deviation occurs, and the tracking control error becomes larger than that of the multiple writing with even number passes. However, as described above, from a viewpoint of throughput improvement, it has been required to execute multiple writing with the minimum number passes which renders one shot dose capable of suppressing the influence of dimensional degradation, etc. due to resist heating to be within an acceptable range. Thus, it has been required to selectively perform odd-number pass multiple writing instead of even-number pass multiple writing. Therefore, as described above, the deviation amount Δ cannot be cancelled out completely. Then, in the first embodiment, there will be described a method for reducing a positional deviation Δ itself due to tracking control regardless of the movement direction, such as the FWD movement and the BWD movement.

Figure 6:
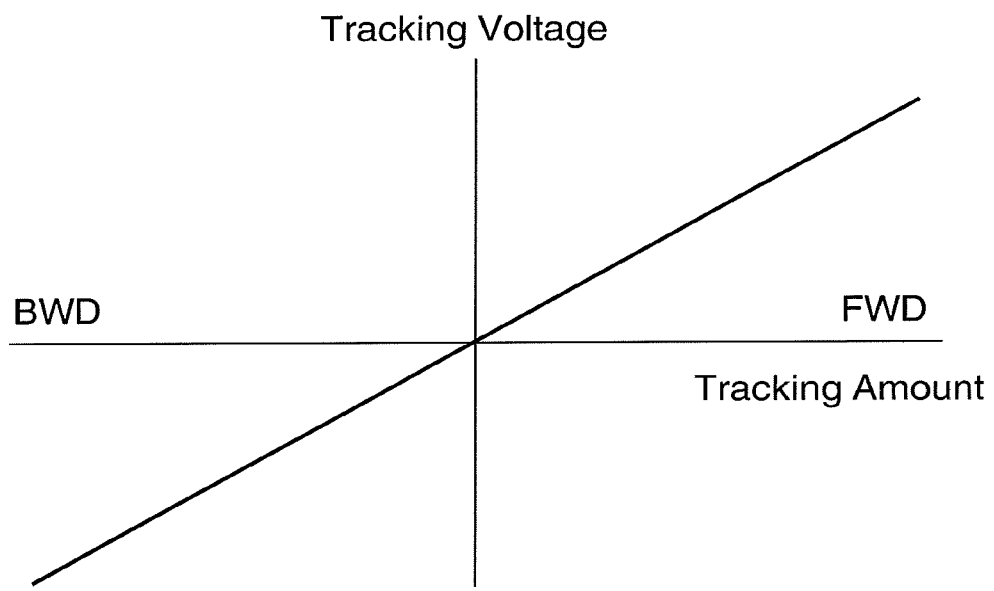
FIG. 6 shows an example of relation between a tracking voltage and a tracking amount according to the first embodiment.

FIG. 6 shows an example of relation between a tracking voltage and a tracking amount according to the first embodiment. Although FIG. 6 shows the case in which the tracking voltage is in linear proportion to the amount of tracking, it is not limited thereto. If a conversion function for converting a tracking amount L to a tracking voltage Et is set as F, the tracking voltage Et can be defined by the following equation (1).

$$Et = k \cdot F(L) \quad (1)$$

The deflection control circuit 120 calculates a tracking amount L necessary for tracking control, based on the movement speed of the stage, and calculates a tracking voltage Et by using the equation (1). The calculation method for the tracking amount L may be the same as the conventional one. A digital signal indicating the tracking voltage Et is output to the DAC amplifier 136. Although the tracking coefficient k is ideally 1, that is k=1, since some deviation occurs in the actual apparatus, a numerical value, not being k=1, may be selected. Conventionally, when starting the writing apparatus, for example, writing of the FWD movement is performed, and the tracking coefficient k is set so that the amount of positional deviation may be small. However, if there is an adjustment deviation in the set value of the tracking coefficient k, when multiple writing with odd number passes is performed, as described above, a tracking control error appears remarkably. Although the equation (1) represents the case in which the whole of the conversion function $F(L)$ depending on the tracking amount L is multiplied by the coefficient k of one value, it is not limited thereto. The conversion function F may be a polynomial, and each term may be multiplied by a different value as a coefficient. In such a case, the tracking coefficient k is a series of coefficients, such as k1, k2, and so on.

Figure 7:
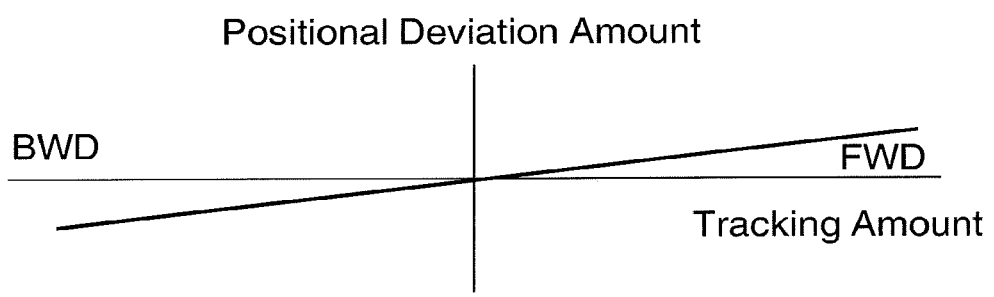
FIG. 7 shows an example of relation between a positional deviation amount and a tracking amount according to the first embodiment.

FIG. 7 shows an example of relation between a positional deviation amount and a tracking amount according to the first embodiment. In FIG. 7, the ordinate axis represents a positional deviation amount, and the abscissa axis represents a tracking amount. As shown in FIG. 7, if there is an adjustment deviation in the set value of the tracking coefficient k, a positional deviation occurs in a written pattern in proportion to the amount of tracking. Moreover, as a result of an experiment, as shown in FIG. 7, it turns out that the sign of positional deviation amount of the writing result by the FWD movement and that of the writing result by the BWD movement are reversed. Then, according to the first embodiment, the tracking coefficient k is optimized so that the positional deviation amount per tracking amount may be close to zero as much as possible regardless of FWD and BWD.

Figure 8:
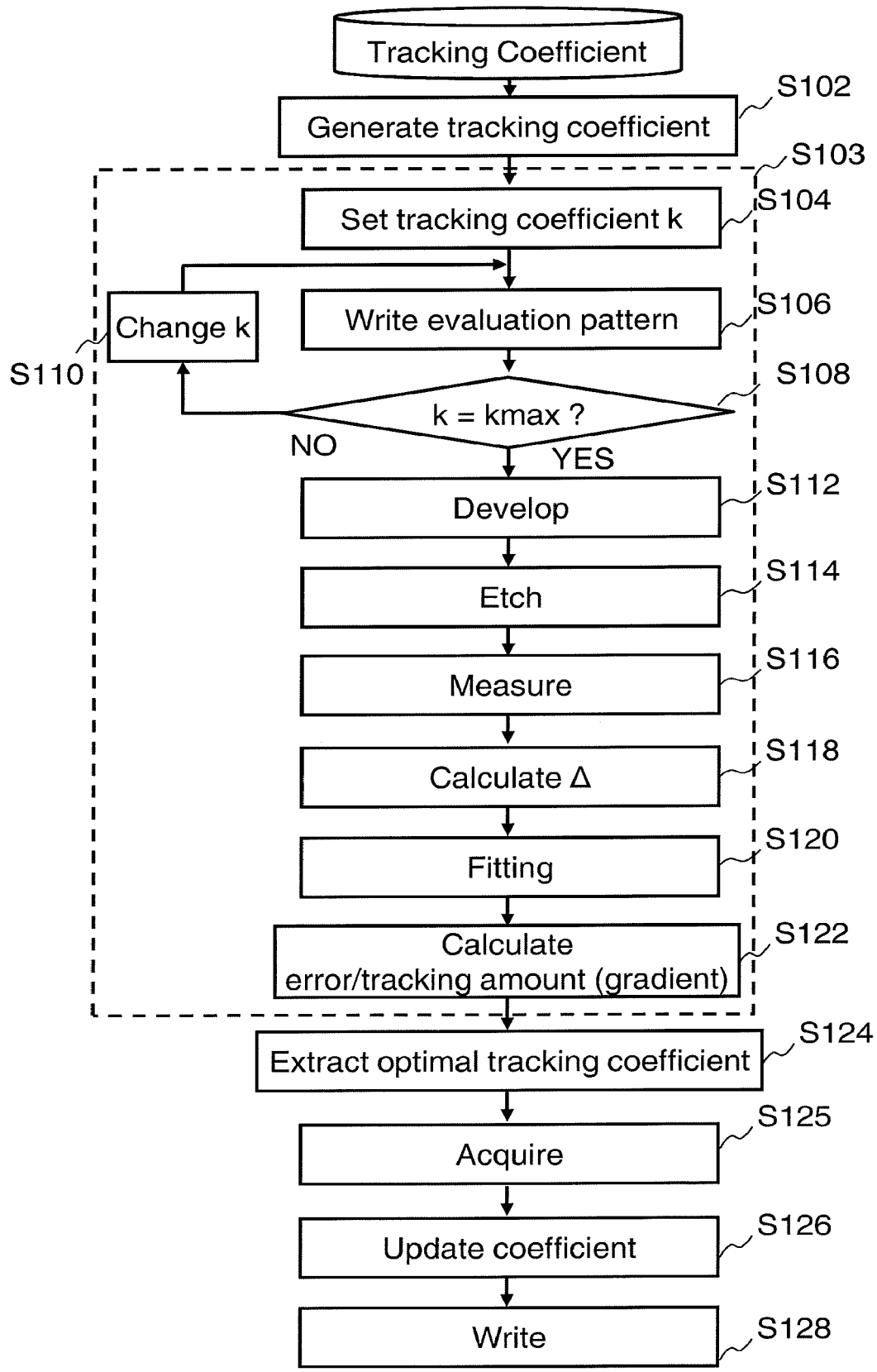
FIG. 8 is a flowchart showing main steps of a writing method according to the first embodiment.

FIG. 8 is a flowchart showing main steps of a writing method according to the first embodiment. In FIG. 8, the writing method of the first embodiment executes a series of steps: a tracking coefficient generating step (S102), an error/tracking amount acquisition step (S103), an optimal tracking coefficient extracting step (S124), an acquisition step (S125), a coefficient updating step (S126), and a writing step (S128). The error/tracking amount acquisition step (S103) executes a series of steps as its internal steps: a tracking coefficient setting step (S104), an evaluation pattern writing step (S106), a determination step (S108), a tracking coefficient change step (S110), a developing step (S112), an etching step (S114), a measuring step (S116), a positional deviation amount n calculation step (S118), a fitting step (S120), and an error/tracking amount calculation step (S122).

First, when starting the writing apparatus 100, the setting unit 62 sets a tracking coefficient k(=ka) by the method to be described later or the method conventionally used. k=1 can be used as an initial value of the tracking coefficient k for acquiring a tracking coefficient ka when starting the writing apparatus 100. If the tracking coefficient changed from k=1 cannot make the positional deviation amount sufficiently small, it suffices to gradually search a value which makes the positional deviation amount small while repeatedly changing the tracking coefficient k. Thereby, first, the tracking coefficient ka used when starting the writing apparatus 100 is set. The tracking coefficient k having been set is stored in the storage device 146. Thus, it means that the tracking coefficient k being currently set is stored in the storage device 146. In the case of replacing the DAC amplifier 134 for main deflection control or the DAC amplifier 136 for tracking control, or in the case of changing the sensitivity of the main deflection region, for example, which is performed at the time of focus adjustment, etc. (changing a sensitivity coefficient not shown), it is preferable, in that case each time, to execute all the steps from the tracking coefficient generating step (S102) to the coefficient updating step (S126) before performing the writing step (S128). Alternatively, it is preferable to periodically execute all the steps from the tracking coefficient generating step (S102) to the coefficient updating step (S126) before performing the writing step (S128).

In the tracking coefficient generating step (S102), using the existing tracking coefficient ka which has already been set in the writing apparatus 100, the coefficient generation unit 52 generates a plurality of tracking coefficients ki centering on the existing tracking coefficient. In other words, the coefficient generation unit 52 generates a plurality of tracking coefficients ki centering on the value of the existing tracking coefficient ka being used by the deflection control circuit 120 (deflection control unit). For example, tracking coefficients kb, kc, kd, and ke described below are automatically generated. The tracking coefficient kb is obtained by adding 0.1% of the value of the existing tracking coefficient ka to the existing one. The tracking coefficient kc is obtained by adding 0.5% of the value of the existing tracking coefficient ka to the existing one. The tracking coefficient kd is obtained by subtracting 0.1% of the value of the existing tracking coefficient ka from the existing one. The tracking coefficient ke is obtained by subtracting 0.5% of the value of the existing tracking coefficient ka from the existing one. The ratio of the adding/subtracting may be preset. As described above, for example, the five tracking coefficients ki (=ka, kb, kc, kd, and ke) centering on the existing tracking coefficient can be generated.

In the error/tracking amount acquisition step (S103), the writing apparatus 100 acquires, for each tracking coefficient ki, a deflection position deviation amount per unit tracking amount, with respect to a plurality of preset tracking coefficients ki for adjusting the amount of tracking to shift the deflection position of the electron beam 200 on the target object 101 in order to follow the movement of the XY stage 105 on which the writing target substrate (target object 101) is placed. Concretely, the values of gradients of the approximation lines A, B, C, D, and E described later are acquired. It will be specifically described below.

In the tracking coefficient setting step (S104), the setting unit 62 sets one of a plurality of generated tracking coefficients ki. Here, since the existing tracking coefficient ka has already been set, resetting is not needed. It is not limited to what is described above, a coefficient other than the tracking coefficient ka having already been set among a plurality of generated tracking coefficients ki may be set.

In the evaluation pattern writing step (S106), for each tracking coefficient ki, the writing apparatus 100 writes an evaluation pattern using at least one tracking amount onto the evaluation substrate while moving the XY stage 105 in the FWD direction (first direction). Furthermore, the writing apparatus 100 writes an evaluation pattern using at least one tracking amount onto the evaluation substrate while moving the XY stage 105 in the BWD direction (second direction) opposite to the FWD direction. As shown in FIG. 7, since the positional deviation amounts are reversed between the FWD direction and the BWD direction, it is possible to acquire the relation between the positional deviation amount and the tracking amount if positional deviation amounts of two tracking amounts, one for the FWD direction and the other for the BWD direction, can be measured. However, in order to improve the accuracy of the relation, it is desirable to acquire positional deviation amounts in the case that a plurality of tracking amounts are used in the FWD direction, and positional deviation amounts in the case that a plurality of tracking amounts are used in the BWD direction. Then, according to the first embodiment, the writing apparatus 100 writes a plurality of figure patterns for which different tracking amounts are required, as evaluation patterns, on the evaluation substrate by using the electron beam 200, and measures a positional deviation amount of each figure pattern configuring the evaluation pattern. For example, a positional deviation amount in the case of a short tracking amount being used, and that in the case of a long tracking amount being used are individually measured.

Figure 9:
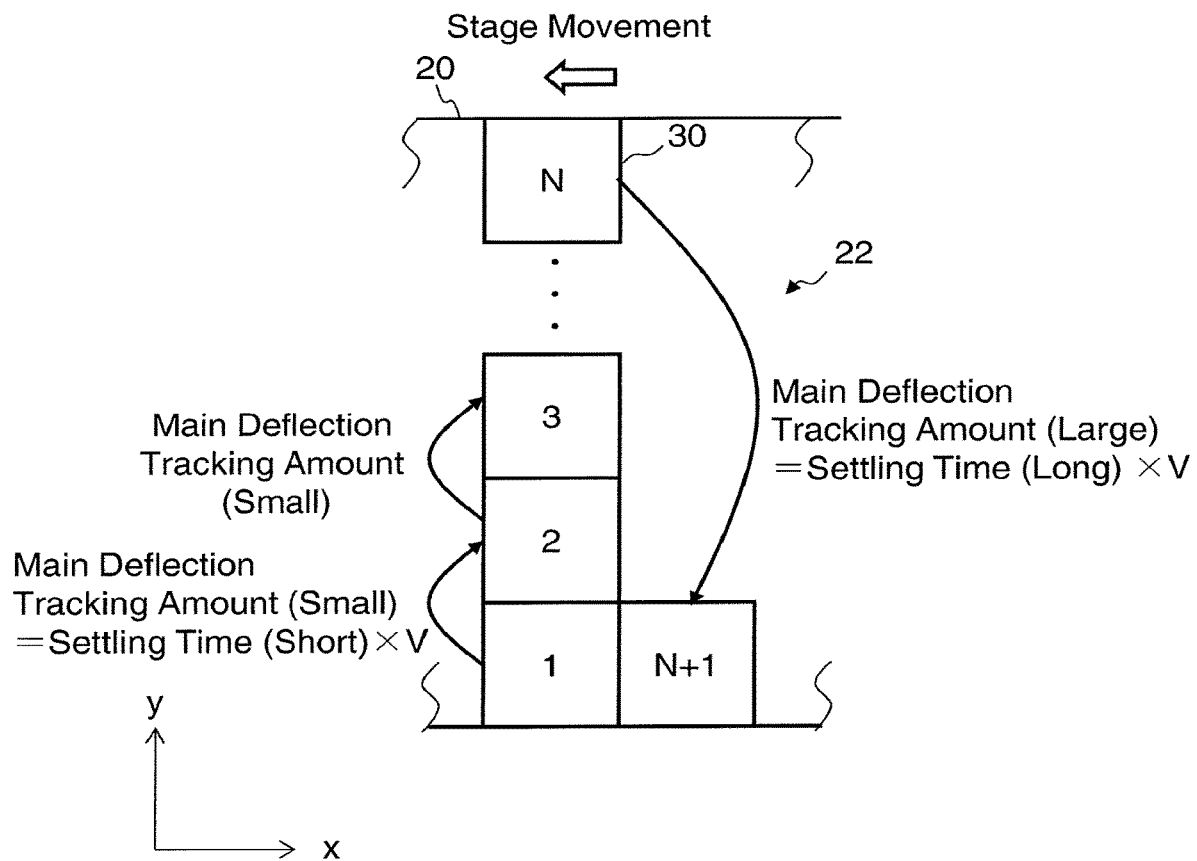
FIG. 9 illustrates a main deflection tracking amount according to the first embodiment.

FIG. 9 illustrates a main deflection tracking amount according to the first embodiment.

Figure 10:
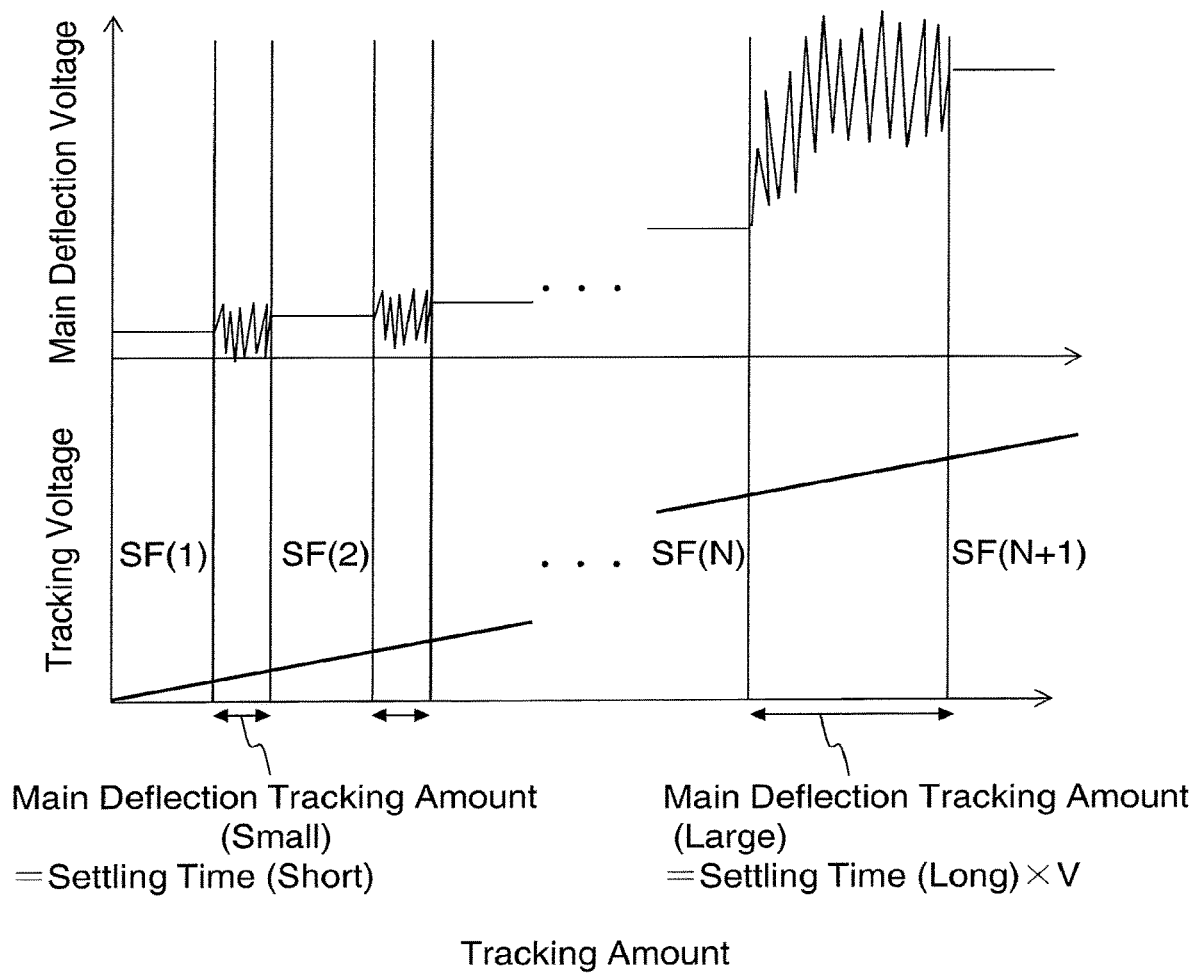
FIG. 10 shows an example of relation among a main deflection voltage, a tracking voltage, and a tracking amount according to the first embodiment.

FIG. 10 shows an example of relation among a main deflection voltage, a tracking voltage, and a tracking amount according to the first embodiment. In FIG. 10, the ordinate axis represents the main deflection voltage and the tracking voltage, and the abscissa axis represents the tracking amount. As described above, the writing processing while performing the FWD movement advances for each column of a plurality of arrayed SFs 30 in the y direction. Therefore, during performing writing in the first SF(1), a sub deflection tracking control which follows the movement of the XY stage 105 is carried out. On the other hand, a main deflection voltage output from the DAC amplifier 134 for main deflection uniquely maintains the deflection voltage for deflecting to the reference position (e.g., center) of the SF(1). Then, after completing writing the first SF(1), settling of the DAC amplifier 134 for the main deflection is executed, and the deflection position of the main deflector 208 is shifted to the reference position (e.g., center) of the second SF(2). During the shifting from SF(1) to SF(2) of the main deflection, the main deflection tracking control which follows the movement of the XY stage 105 is performed. The tracking amount (main deflection tracking amount) from SF(1) to SF(2) by the main deflection tracking control can be defined by the value obtained by multiplying the settling time of the DAC amplifier 134 by the movement speed V of the XY stage 105. Since the distance of the main deflection shifting from SF(1) to SF(2) is short, the settling time of the DAC amplifier 134 is also short. Similarly, since the distance of the main deflection movement from SF(2) to SF(3) is short, the settling time of the DAC amplifier 134 is also short. On the other hand, since the distance of the main deflection movement from SF(N) being the last of writing processing in a plurality of SFs arrayed as a column in the y direction to SF(N+1) being the beginning of the next SF 30 adjacent in the x direction is long, the settling time of the DAC amplifier 134 is also long. Since the tracking amount (main deflection tracking amount) (distance) from SF(N) to SF(N+1) by the main deflection tracking control can be defined by the value obtained by multiplying the settling time of the DAC amplifier 134 by the movement speed V of the XY stage 105, the tracking amount (main deflection tracking amount) (distance) from SF(N) to SF(N+1) by the main deflection tracking control becomes large in accordance with the length of the settling time. Then, it is possible to measure a positional deviation amount in accordance with the tracking amount by measuring the position of a pattern written after shifting between adjacent SFs 30 by the main deflector 208, where the settling time of the DAC amplifier 134 is set short, and measuring the position of a pattern written after shifting between SFs 30 away from each other by the size of a plurality of SFs, where the settling time of the DAC amplifier 134 is set long.

Then, first, the data processing unit 50 reads evaluation pattern data from the storage device 140, and by performing data processing in multiple stages, generates shot data for writing an evaluation pattern. There is restriction on the size and shape which can be irradiated by one beam shot of the writing apparatus 100. Then, one shot figure having a size and shape which can write an evaluation pattern is generated. Alternatively, an evaluation pattern is divided into a plurality of shot figures which can write the evaluation pattern. The shot data defines the figure code indicating the figure type of a shot figure, arrangement coordinates, dimensions, etc. In addition, dose information may be defined in the data. Alternatively, dose information may be input as another data.

Figure 11:
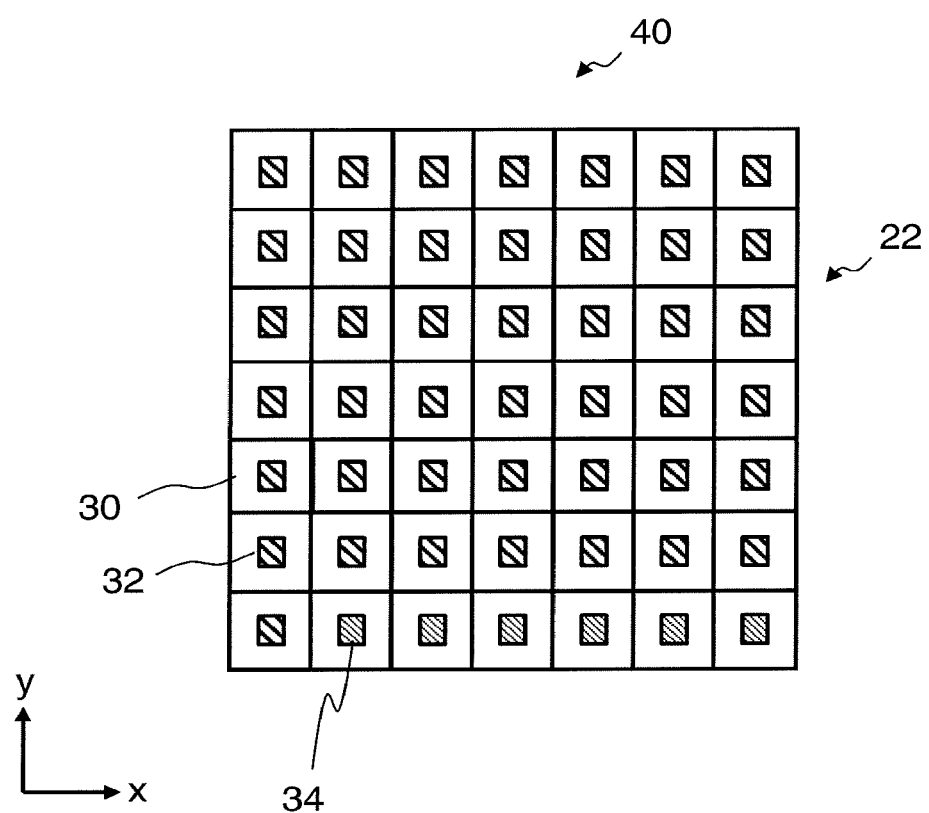
FIG. 11 shows an example of an evaluation pattern according to the first embodiment.

FIG. 11 shows an example of an evaluation pattern according to the first embodiment. In the case of FIG. 11, a rectangular, including a square, pattern 32 (or rectangular, including a square, pattern 34) is arranged as an evaluation pattern 40 in each SF 30. Thus, the evaluation pattern 40 is composed of a plurality of rectangular patterns 32 and 34 (figure patterns). The rectangular pattern 32 is written after shifting between SFs 30 where the main deflection tracking amount is small. The rectangular pattern 34 is written after shifting between SFs 30 where the main deflection tracking amount is large. The rectangular patterns 32 and 34 may have the size formable using one shot, or the size formed by combining a plurality of shot figures. In the case of the FWD movement, since the SF in the first of columns arrayed in the x direction in the first row from the bottom is the beginning of the tracking, the main deflection tracking amount is not particularly large, and therefore, the rectangular pattern 32 is written. In the case of the BWD movement, since the SF in the seventh of columns arrayed in the x direction in the first row from the bottom is the beginning of the tracking, the rectangular pattern 34, not the rectangular pattern 32, is written in the SF in the first of columns arrayed in the x direction in the first row from the bottom, and the rectangular pattern 32, not the rectangular pattern 34, is written in the SF in the seventh of columns arrayed in the x direction in the first row from the bottom.

As described above, while the FWD movement is being performed, the evaluation pattern 40 is written on the evaluation substrate (not shown) on which resist has been applied, and while the BWD movement is being performed, the evaluation pattern 40 is written in a different region from the writing region written during the FWD movement.

In the determination step (S108), the determination unit 66 determines whether evaluation patterns have been written using all the generated tracking coefficients ki while performing the FWD movement and the BWD movement. In other words, it is determined whether the index "i" of the tracking coefficient ki has been set as "a" to "e". If the evaluation patterns have not been written using all the generated tracking coefficients ki, it goes to the tracking coefficient change step (S110). If the evaluation patterns have been written using all the generated tracking coefficients ki, it goes to the developing step (S112).

In the tracking coefficient change step (S110), the change unit 67 changes the tracking coefficient being currently set to one of tracking coefficients which have not been set yet among the generated tracking coefficients ki (=ka, kb, kc, kd, and ke). For example, the tracking coefficient ka is changed to the tracking coefficient kb. Then, it returns to the evaluation pattern writing step (S106).

The evaluation pattern writing step (S106), the determination step (S108), and the tracking coefficient change step (S110) are repeated until evaluation patterns have been written using all the generated tracking coefficients ki while performing the FWD movement and the BWD movement. In that case, the evaluation pattern writing using each tracking coefficient ki is carried out in each writing region such that the each writing region is different from each other on the evaluation substrate. By this, an evaluation pattern concerning the FWD movement and an evaluation pattern concerning the BWD movement are written, with respect to each tracking coefficient ki, on the evaluation substrate while shifting the writing region. The evaluation substrate having been written is taken out from the writing chamber 103 of the writing apparatus 100. It is not limited to the case of writing all the evaluation patterns on one evaluation substrate. It is also preferable to dividedly write evaluation patterns on a plurality of evaluation substrates.

In the developing step (S112), developing processing is performed for the written evaluation substrate. Thereby, a resist pattern composed of an evaluation pattern written during the FWD movement and an evaluation pattern written during the BWD movement is formed for each tracking coefficient ki.

In the etching step (S114), etching is conducted using a resist pattern remains on the evaluation substrate, as a mask. A light shielding film such as chromium (Cr) should be formed on the whole surface of the evaluation substrate in advance, and a resist film is to be applied thereto. By the etching step (S114), an evaluation pattern of light shielding film written during the FWD movement and an evaluation pattern of light shielding film written during the BWD movement are formed on the evaluation substrate for each tracking coefficient ki. It goes without saying that ashing treatment for exfoliating the resist material is performed after the etching processing.

In the measuring step (S116), using a position measuring device, the positions of the evaluation pattern of light shielding film written during the FWD movement and the evaluation pattern of light shielding film written during the BWD movement are measured for each tracking coefficient ki. In other words, the writing position of the rectangular pattern 32 for which a small tracking amount (main deflection tracking amount) is used in FWD movement writing, the writing position of the rectangular pattern 34 for which a large tracking amount (main deflection tracking amount) is used in FWD movement writing, the writing position of the rectangular pattern 32 for which a small tracking amount (main deflection tracking amount) is used in BWD movement writing, and the writing position of the rectangular pattern 34 for which a large tracking amount (main deflection tracking amount) is used in BWD movement writing are measured for each tracking coefficient ki.

Although the case of measuring the position of the evaluation pattern of light shielding film is shown in the example described above, it is not limited thereto. For example, the position of the evaluation pattern of resist film, in the state of a resist pattern, may be measured.

In the positional deviation amount $\Delta$ calculation step (S118), a positional deviation amount $\Delta$ of the evaluation pattern is calculated by subtracting the position of each measured evaluation pattern from the position of each design evaluation pattern. In other words, the positional deviation amount $\Delta$ of the rectangular pattern 32 for which a small tracking amount (main deflection tracking amount) is used in FWD movement writing, the positional deviation amount $\Delta$ of the rectangular pattern 34 for which a large tracking amount (main deflection tracking amount) is used in FWD movement writing, the positional deviation amount $\Delta$ of the rectangular pattern 32 for which a small tracking amount (main deflection tracking amount) is used in BWD movement writing, and the positional deviation amount $\Delta$ of the rectangular pattern 34 for which a large tracking amount (main deflection tracking amount) is used in BWD movement writing are calculated for each tracking coefficient ki. Furthermore, in other words, for each tracking coefficient ki, the deviation amount of the deflection position in at least one tracking amount is measured while moving the XY stage 105 in the FWD direction, and the deviation amount of the deflection position in at least one tracking amount is measured while moving the XY stage 105 in the BWD direction opposite to the FWD direction.

Figure 12A:
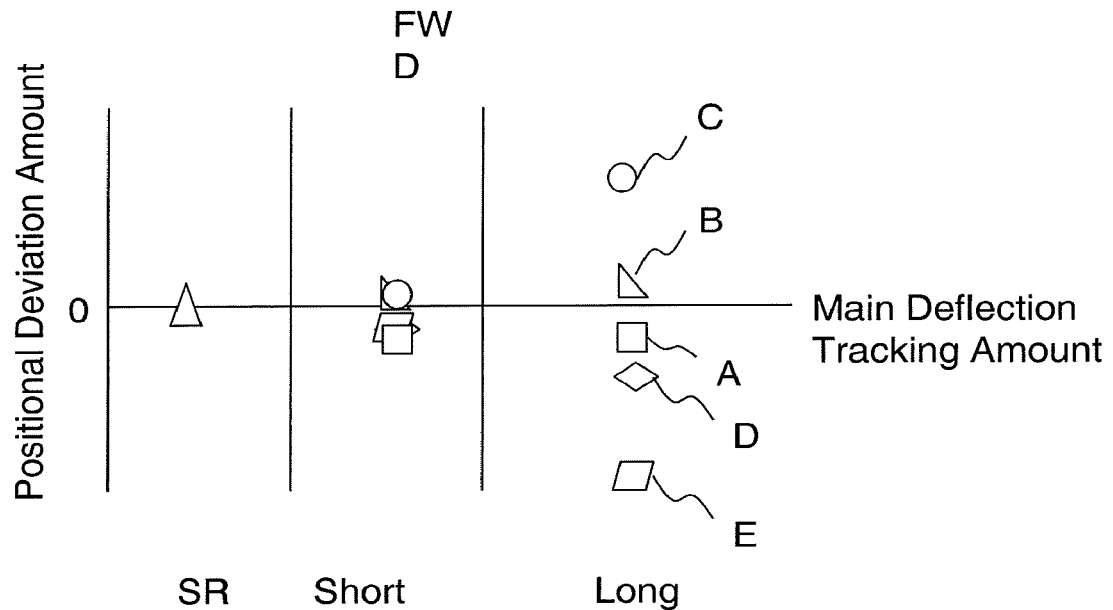
FIGS. 12A and 12B show examples of a measurement result of a tracking amount and a positional deviation amount according to the first embodiment.
Figure 12B:
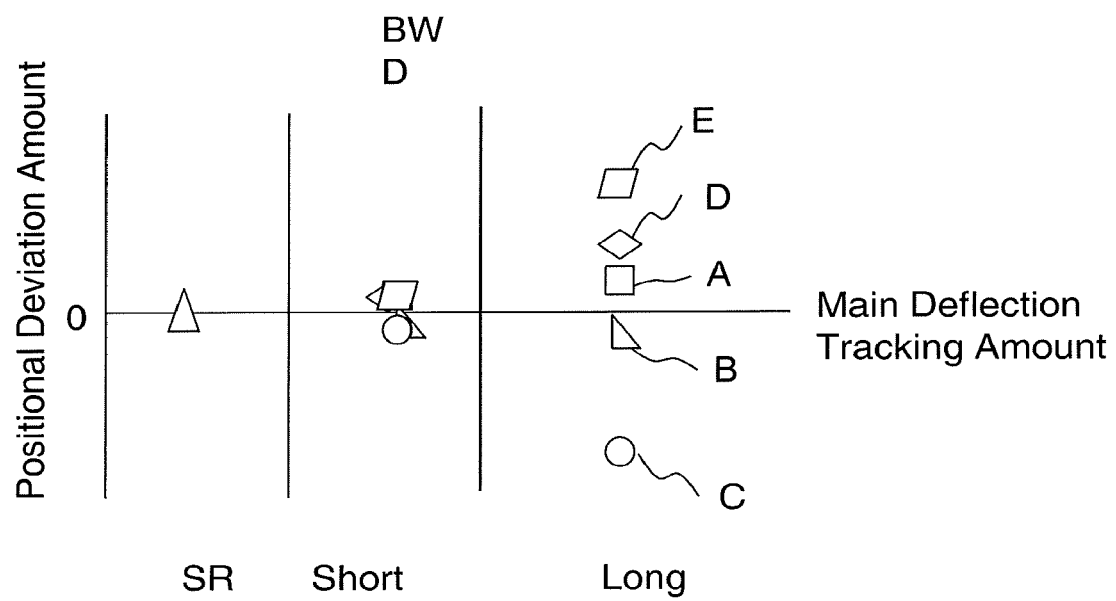

FIGS. 12A and 12B show examples of a measurement result of a tracking amount and a positional deviation amount according to the first embodiment. In FIGS. 12A and 12B, the ordinate axis represents a positional deviation amount, and the abscissa axis represents a type of a tracking amount. Moreover, FIG. 12A shows positional deviation amounts of evaluation patterns A to E in FWD movement writing. FIG. 12B shows positional deviation amounts of the evaluation patterns A to E in BWD movement writing. FIGS. 12A and 12B show a writing result A of writing using the existing tracking coefficient ka, a writing result B of writing using the tracking coefficient kb obtained by adding 0.1% of the value of the existing tracking coefficient ka to the existing one, a writing result C of writing using the tracking coefficient kc obtained by adding 0.5% of the value of the existing tracking coefficient ka to the existing one, a writing result D of writing using the tracking coefficient kd obtained by subtracting 0.1% of the value of the existing tracking coefficient ka from the existing one, and a writing result E of writing using the tracking coefficient ke obtained by subtracting 0.5% of the value of the existing tracking coefficient ka from the existing one. In addition, as a value for reference, there is shown a result of writing by a step-and-repeat (SR) operation which needs no tracking. In the step-and-repeat (SR) operation, since tracking is unnecessary, the tracking amount is zero, and the positional deviation amount resulting from tracking control is also zero. Moreover, when the tracking amount (main deflection tracking amount) is small (short), the positional deviation amounts $\Delta$ of all the tracking coefficients are also small. By contrast, when the tracking amount (main deflection tracking amount) is large (long), the positional deviation amount $\Delta$ largely varies depending on the value of the tracking coefficient. Moreover, it turns out that the signs of the positional deviation amount $\Delta$ by the FWD movement and that by the BWD movement are reversed. The measured data (positional deviation data) obtained as described above is input from the outside of the writing apparatus 100, and stored in the storage device 144.

In the fitting step (S120), the fitting unit 56 carries out fitting (approximates) of the positional deviation amount with respect to the tracking amount in each movement direction, by an approximation function, based on acquired measured data (positional deviation data). For example, approximation is performed by a linear function.

Figure 13:
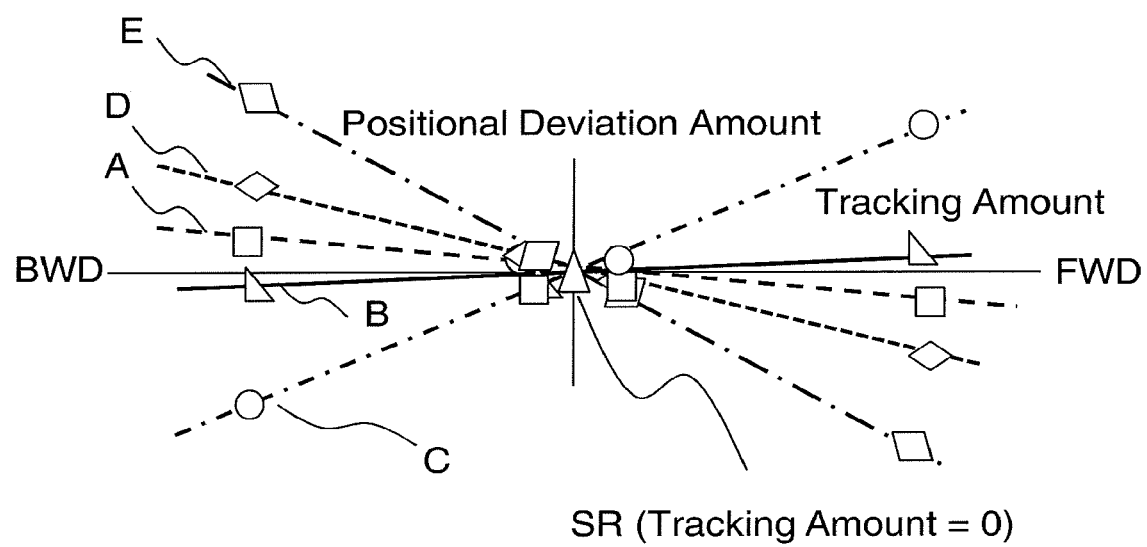
FIG. 13 shows an example of relation between a tracking amount and a positional deviation amount according to the first embodiment.
Figure 14:
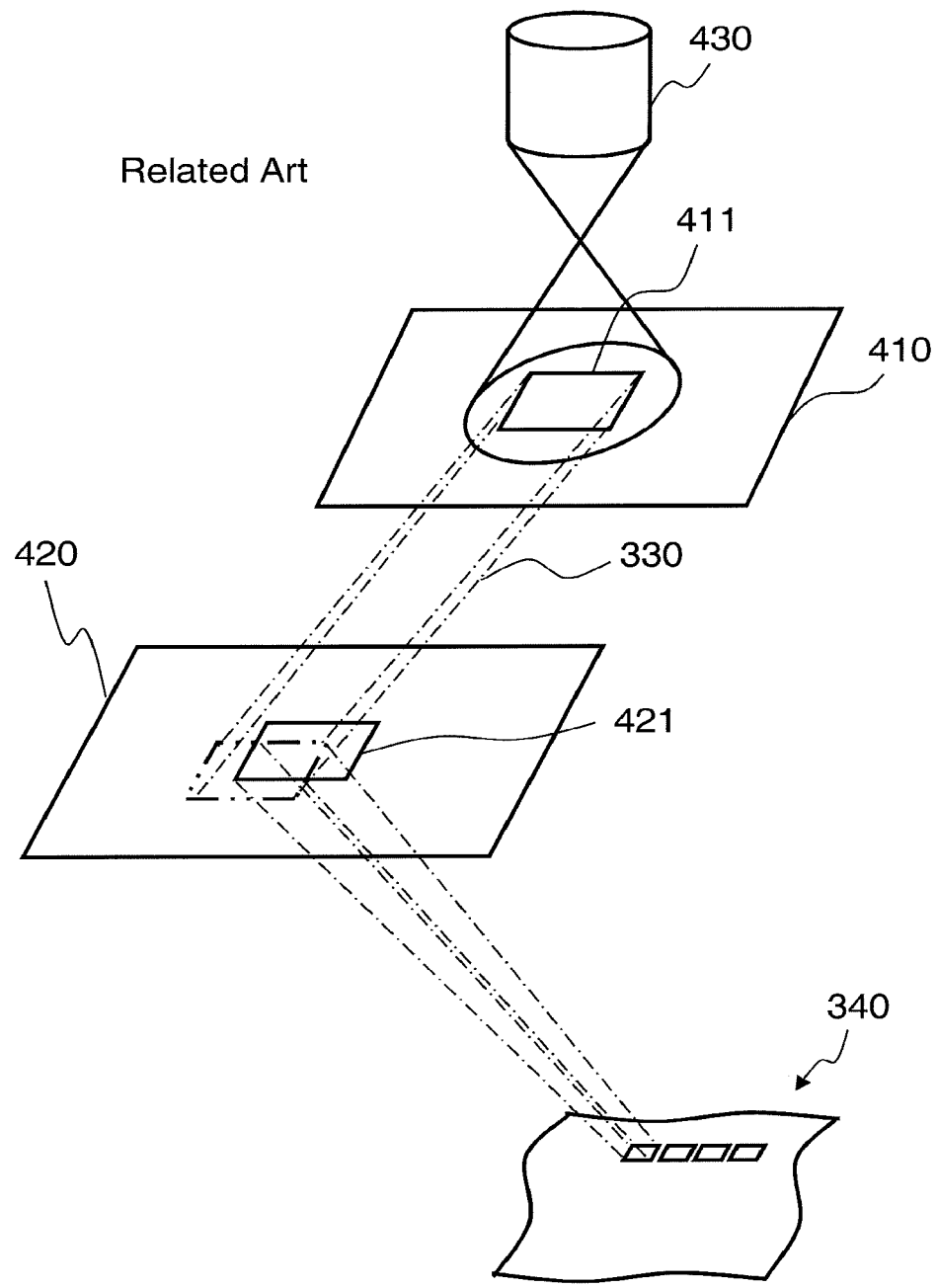
FIG. 14 is a conceptual diagram explaining operations of a variable-shaped electron beam writing apparatus.

FIG. 13 shows an example of relation between a tracking amount and a positional deviation amount according to the first embodiment. In the case of FIG. 13, the ordinate axis represents a positional deviation amount, the right side of the abscissa axis represents a tracking amount in FWD movement writing, and the left side represents a tracking amount in BWD movement writing. In FIG. 13, measurement results are plotted to show approximation lines A, B, C, D, and E approximated for each of the tracking coefficients ka to ke.

In the error/tracking amount calculation step (S122), the gradient calculation unit 58 calculates, for each tracking coefficient ki, a deflection position deviation amount per unit tracking amount by using a deviation amount of the deflection position in at least one tracking amount measured while moving the XY stage 105 to proceed writing in the FWD direction, and a deviation amount of the deflection position in at least one tracking amount measured while moving the XY stage 105 to proceed writing in the BWD direction. Specifically, the gradient calculation unit 58 calculates the gradient of each of the approximation lines A, B, C, D, and E approximated for each of the tracking coefficients ka to ke. The calculated gradients of the approximation lines A, B, C, D, and E are stored in the storage device 144 such that they individually correspond to the tracking coefficients ka to ke.

In the optimal tracking coefficient extracting step (S124), the extraction unit 60 extracts a tracking coefficient based on which the deflection position deviation amount (gradient) per unit tracking deflection amount is closest to zero among a plurality of tracking coefficients ki. In other words, the tracking coefficient that gives a case most similar to the case where the deviation amount of the deflection position is a constant value regardless of the tracking amount is extracted as an optimum value. In the example of FIG. 13, since the gradient of the approximation line B of the tracking coefficient kb is closest to zero among the approximation lines A, B, C, D, and E of the tracking coefficients ka, kb, kc, kd, and ke, the extraction unit 60 extracts the tracking coefficient kb as an optimum value among a plurality of tracking coefficients ka to ke.

In the examples described above, the developing step (S112), etching step (S114), measuring step (S116), and positional deviation amount $\Delta$ calculation step (S118) are carried out outside the writing apparatus 100, and the fitting step (S120) and error/tracking amount calculation step (S122) are carried out inside the writing apparatus 100. However, it is not limited to those examples. For example, the developing step (S112), etching step (S114), measuring step (S116), positional deviation amount $\Delta$ calculation step (S118), fitting step (S120), and error/tracking amount calculation step (S122) may be executed outside the writing apparatus 100. In that case, for each tracking coefficient ki, the deflection position deviation amount per unit tracking amount is input from the outside of the writing apparatus 100, and stored in the storage device 144. Alternatively, the developing step (S112), etching step (S114), and measuring step (S116) may be carried out outside the writing apparatus 100. In that case, information on the measurement position of each evaluation pattern is input from the outside of the writing apparatus 100, and stored in the storage device 144. Then, each positional deviation amount $\Delta$ described above may be calculated by a calculation unit (not shown). The contents of the steps after the fitting step (S120) are the same as those described above. Alternatively, the developing step (S112), etching step (S114), measuring step (S116), positional deviation amount $\Delta$ calculation step (S118), fitting step (S120), error/tracking amount calculation step (S122), and optimal tracking coefficient extracting step (S124) may be carried out outside the writing apparatus 100. In that case, the tracking coefficient (e.g., tracking coefficient kb) being an optimal value among a plurality of tracking coefficients ki is input from the outside of the writing apparatus 100, and stored in the storage device 144.

In the acquisition step (S125), the acquisition unit 54 acquires a tracking coefficient (e.g., tracking coefficient kb) based on which the deflection position deviation amount per unit tracking deflection amount is closest to zero among a plurality of tracking coefficients ki.

In the coefficient updating step (S126), the update unit 64 (update control unit) updates the existing tracking coefficient (e.g., tracking coefficient ka) to an acquired tracking coefficient (e.g., tracking coefficient kb).

In the writing step (S128), first, the data processing unit 50 reads chip pattern data from the storage device 140, and by performing data processing in multiple stages, generates shot data for writing a chip pattern. Specifically, one shot figure having a size and shape which can write a chip pattern is generated. Alternatively, the chip pattern is divided into a plurality of shot figures which can write the chip pattern. The shot data defines the figure code indicating the figure type of a shot figure, arrangement coordinates, dimensions, etc. In addition, dose information may be defined in the data. Alternatively, dose information may be input as another data. Preferably, the shot data is generated, for example, for each shot figure or each array figure. The generated shot data is stored in the storage device 142. Under the control of the writing control unit 68, the deflection control circuit 120 controls the amount of tracking of the electron beam 200 by the deflector 208, using a tracking coefficient for adjusting the amount of tracking to shift the deflection position of the electron beam 200 on the target object 101 (substrate) so as to follow the movement of the XY stage 105. Specifically, the deflection control circuit 120 generates tracking data for tracking control which indicates a tracking voltage calculated using the equation (1), for example. Moreover, the deflection control circuit 120 reads shot data from the storage device 140, and generates main deflection data and sub deflection data for each shot. The generated tracking data, main deflection data, and sub deflection data are output to corresponding DAC amplifiers in accordance with a writing sequence. Then, under the control of the writing control unit 68, the control circuit 122 controls the writing mechanism 150. The writing mechanism 150 writes a pattern on the target object 101, using the electron beam 200, while moving the XY stage 105 and shifting the deflection position of the electron beam 200 on the target object 101 (substrate) so as to follow the movement of the XY stage 105. Specifically, the writing mechanism 150 writes a pattern on the target object 101 (substrate), using the electron beam 200, while the deflection control circuit 120 performs tracking control in which the tracking amount has been adjusted using an extracted tracking coefficient (e.g., tracking coefficient kb).

As described above, according to the first embodiment, it is possible to reduce the deviation amount of the deflection position in tracking control. Therefore, errors occurring along with the stage movement can be reduced. Furthermore, according to the first embodiment, errors occurring along with the stage movement can be reduced irrespective of the case of multiple writing with odd number passes or the case of multiple writing with even number passes.

Embodiments have been explained referring to specific examples described above. However, the present invention is not limited to these specific examples. Although, in the above examples, the amount of tracking (main deflection tracking amount) is controlled by the distance between SFs 30 based on the main deflection movement, it is not limited thereto. It is also preferable to control the tracking amount (main deflection tracking amount) by just variably setting the settling time set in the DAC amplifier 134 for the main deflection.

While the apparatus configuration, control method, and the like not directly necessary for explaining the present invention are not described, some or all of them can be selectively used case-by-case basis. For example, although description of the configuration of the control system for controlling the writing apparatus 100 is omitted, it should be understood that some or all of the configuration of the control system can be selected and used appropriately when necessary.

In addition, any other charged particle beam writing method and charged particle beam writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A charged particle beam writing method comprising:
   acquiring a deviation amount of a deflection position per unit tracking deflection amount with respect to each tracking coefficient of a plurality of tracking coefficients having been set for adjusting a tracking amount to shift the deflection position of a charged particle beam on a writing target substrate in order to follow movement of a stage on which the writing target substrate is placed;
   extracting a tracking coefficient based on which the deviation amount of the deflection position per the unit tracking deflection amount is closest to zero among the plurality of tracking coefficients; and
   writing a pattern on the writing target substrate with the charged particle beam while performing tracking control in which the tracking amount has been adjusted using the tracking coefficient extracted.

2. The method according to claim 1, wherein the acquiring the deviation amount of the deflection position per the unit tracking deflection amount includes
   measuring, for the each tracking coefficient, the deviation amount of the deflection position with respect to at least one tracking amount while moving the stage in order to proceed writing in a first direction, and measuring the deviation amount of the deflection position with respect to at least one tracking amount while moving the stage in order to proceed writing in a second direction opposite to the first direction; and
   calculating, for the each tracking coefficient, the deviation amount of the deflection position per the unit tracking deflection amount by using the deviation amount of the deflection position with respect to the at least one tracking amount measured in a case of moving the stage in order to proceed writing in the first direction, and the deviation amount of the deflection position with respect to the at least one tracking amount measured in a case of moving the stage in order to proceed writing in the second direction.

3. The method according to claim 1, further comprising:
   writing, with the charged particle beam, a plurality of figure patterns for which different tracking amounts are required, as evaluation patterns, on an evaluation substrate.

4. The method according to claim 1, further comprising:
   generating, using an existing tracking coefficient which has already been set in a writing apparatus, the plurality of tracking coefficients centering on the existing tracking coefficient.

5. The method according to claim 2, wherein the acquiring the deviation amount of the deflection position per the unit tracking deflection amount further includes
   fitting, for the each tracking coefficient, the deviation amount of the deflection position with respect to the at least one tracking amount measured in the case of moving the stage in order to proceed writing in the first direction, and the deviation amount of the deflection position with respect to the at least one tracking amount measured in the case of moving the stage in order to proceed writing in the second direction, wherein
   the deviation amount of the deflection position per the unit tracking deflection amount is calculated as a gradient of a fitted approximation line, for the each tracking coefficient.

6. A charged particle beam writing apparatus comprising:
   a writing mechanism configured to include an emission source for emitting a charged particle beam, a stage for mounting a substrate thereon, and a deflector for deflecting the charged particle beam, and to write a pattern on the substrate with the charged particle beam while moving the stage and shifting a deflection position of the charged particle beam on the substrate to follow movement of the stage;

a deflection control circuit configured to control a tracking amount of the charged particle beam which is deflected by the deflector, using a tracking coefficient for adjusting the tracking amount to shift the deflection position of the charged particle beam on the substrate in order to follow the movement of the stage;

a tracking coefficient generation circuit configured to generate a plurality of tracking coefficients centering on a value of an existing tracking coefficient currently used by the deflection control circuit; and an update circuit configured to update the existing tracking coefficient to a tracking coefficient based on which a deviation amount of the deflection position per unit tracking deflection amount is closest to zero among the plurality of tracking coefficients.

7. The apparatus according to claim 6 further comprising:
an acquisition circuit configured to acquire the tracking coefficient based on which the deviation amount of the deflection position per the unit tracking deflection amount is closest to zero among the plurality of tracking coefficients.

8. The apparatus according to claim 6 further comprising:
a fitting circuit configured to fit, for each tracking coefficient of the plurality of tracking coefficients, the deviation amount of the deflection position of the charged particle beam with respect to at least one tracking amount in a case of writing an evaluation pattern while moving the stage in order to proceed writing in a first direction, and the deviation amount of the deflection position of the charged particle beam with respect to at least one tracking amount in a case of writing the evaluation pattern while moving the stage in order to proceed writing in a second direction opposite to the first direction.

9. The apparatus according to claim 8, further comprising:
a gradient calculation circuit configured to calculate, for the each tracking coefficient, a gradient of a fitted approximation line.

10. The apparatus according to claim 9, further comprising:
an extraction circuit configured to extract the tracking coefficient based on which the gradient is closest to zero among the plurality of tracking coefficients.

* * * * *